(12) United States Patent
Tanie et al.

(10) Patent No.: US 8,368,195 B2
(45) Date of Patent: Feb. 5, 2013

(54) SEMICONDUCTOR DEVICE INCLUDING ARRANGEMENT TO CONTROL CONNECTION HEIGHT AND ALIGNMENT BETWEEN A PLURITY OF STACKED SEMICONDUCTOR CHIPS

(75) Inventors: Hisashi Tanie, Mito (JP); Takeyuki Itabashi, Hitachi (JP); Nobuhiko Chiwata, Matsue (JP); Motoki Wakano, Yasugi (JP)

(73) Assignee: Hitachi Metals, Ltd., Tokyo (JP)

( * ) Notice: Subject to any disclaimer, the term of this patent is extended or adjusted under 35 U.S.C. 154(b) by 363 days.

(21) Appl. No.: 12/652,245

(22) Filed: Jan. 5, 2010

(65) Prior Publication Data
US 2010/0171209 A1     Jul. 8, 2010

(30) Foreign Application Priority Data
Jan. 5, 2009   (JP) .................................. 2009-000070

(51) Int. Cl.
*H01L 23/02* (2006.01)
(52) U.S. Cl. ........ 257/686; 257/723; 257/773; 257/774; 257/E21.705; 257/E23.168; 257/E25.013; 438/109
(58) Field of Classification Search ................. 257/686, 257/723, 773, 774, E21.705, E23.168, E25.013; 438/109
See application file for complete search history.

(56) References Cited

U.S. PATENT DOCUMENTS

2005/0263869 A1* 12/2005 Tanaka et al. ................. 257/686
2007/0262452 A1* 11/2007 Oi ................................. 257/758

FOREIGN PATENT DOCUMENTS

| JP | 2000-260933 | 9/2000 |
| JP | 2001-094041 | 4/2001 |
| JP | 2005-340389 | 12/2005 |
| JP | 2007-053149 | 3/2007 |
| JP | 2007-305774 | 11/2007 |

\* cited by examiner

*Primary Examiner* — Andy Huynh
(74) *Attorney, Agent, or Firm* — Antonelli, Terry, Stout & Kraus, LLP.

(57) ABSTRACT

A semiconductor device having stacked semiconductor chips is provided wherein alignment of even thin semiconductor chips of a large warpage is easy and thus high assembling accuracy and high reliability are ensured. Semiconductor chips having hollow through-silicon via electrodes each formed with a tapered portion are melt-joined using solder balls each having a core of a material higher in melting point than solder. When melt-joining the semiconductor chips, the temperature is raised while imparting an urging load to stacked semiconductor chips, thereby correcting warpage of the semiconductor chips. In each chip-to-chip connection thus formed, if the connection is to prevent the occurrence of stress around the electrode due to the urging load, a solder ball having a core of a smaller diameter than in the other connections is used in the connection.

6 Claims, 10 Drawing Sheets

SEMICONDUCTOR DEVICE INCLUDING ARRANGEMENT TO CONTROL CONNECTION HEIGHT AND ALIGNMENT BETWEEN A PLURITY OF STACKED SEMICONDUCTOR CHIPS

CLAIM OF PRIORITY

The present application claims priority from Japanese patent application serial No. 2009-000070 filed on Jan. 5, 2009, the content of which is hereby incorporated by reference into this application

BACKGROUND OF THE INVENTION

1. Field of the Invention

The present invention relates to a high-density packaging technique for a semiconductor device.

2. Explanation of the Related Art

Various information devices, including large-sized computers, personal computers and portable devices, have been becoming higher in performance and smaller in size year by year. Consequently, semiconductor elements and semiconductor chips mounted on those devices are also becoming larger in size and their mounting space is becoming smaller. Under the circumstances, there has been a strong market demand for high-density packaging to mount many semiconductor chips on a limited space. To meet this demand, there has been developed a technique of mounting plural semiconductor chips in a stacked state and in association with this technique there has been developed a packaging method which uses through-silicon via electrodes for mutual connection of chips.

For example, a technique which uses hollow electrodes as through-silicon via electrodes for stacking chips is disclosed in Japanese Patent Laid-Open No. 2000-260933, Japanese Patent Laid-Open No. 2001-94041, Japanese Patent Laid-Open No. 2005-340389 and Japanese Patent Laid-Open No. 2007-53149. For connection between stacked semiconductor chips there are used thin metal wires in Japanese Patent Laid-Open No. 2000-260933, solder balls in Japanese Patent Laid-Open No. 2001-94041, and gold stud bumps in Japanese Patent Laid-Open Nos. 2005-340389 and 2007-53149. As a connecting method other than the method using through-silicon via electrodes there also has been developed a connecting method using cored solder balls, which is disclosed in Japanese Patent Laid-Open No. 2007-305774.

In connection with semiconductor devices wherein semiconductor chips are mounted in a stacked state, there is a recent tendency to thinning and reduction in size of semiconductor chips in order to improve the packaging density. However, if a semiconductor chip is thinned to a thickness of, say, 100 µm or smaller, warpage of the semiconductor chip before stacking becomes large. Consequently, in the case of stacking plural semiconductor chips, the assembling accuracy decreases, with a consequent fear of occurrence of defective connection in an early stage of assembly and lowering in connection reliability in a working environment. Further, in the case of using reduced-size semiconductor chips of about 1 to 10 mm square, it is difficult to effect positioning of the semiconductor chips with respect to each other at the time of assembly.

According to the above conventional techniques, if there are used coreless solder balls when the temperature is raised while imparting an urging load to the semiconductor chip to correct warpage, molten solder is crushed by the urging load, with the result that not only it is difficult to control the connection height but also, in the case where there is a temperature distribution within the semiconductor device, the solder melting time differs among connections and hence there occurs tilting of the semiconductor chip.

It is an object of the present invention to solve the above-mentioned problems and provide a semiconductor device wherein the connection height control between semiconductor chips and the alignment in the chip surface direction are easy even in the case of the semiconductor chips being thin and large in warpage and which is high in both assembling accuracy and reliability.

SUMMARY OF THE INVENTION

According to the present invention, for achieving the above-mentioned object, there is provided a semiconductor device including a plurality of stacked semiconductor chips each having a plurality of electrodes including through-via electrodes and external connecting electrodes, the electrodes provided in the semiconductor chips being connected by solder to form connections, thereby providing electric conduction between the semiconductor chips, wherein a recess is formed in at least one surface of the through-via electrode in each of the connections of the interconnected semiconductor chips, and the solder is provided in the interior thereof with a core formed of a material higher in melting point than the solder, the core being adapted to engage in the recess upon melting of the recess to effect positioning between the semiconductor chips.

The through-via electrodes are each a hollow through-via electrode having a hollow portion.

The core may be formed by a spherical conductor or insulator.

The recess is a tapered portion formed coaxially with the through-via electrode.

The core includes two types of cores, one of the cores being a large-diameter core and the other a small-diameter core.

The large-diameter core is disposed in each of the connections used for the supply of electric power and the small-diameter core is disposed in each of wiring portions used for transmission and reception of signals.

According to the present invention there also is provided a method for manufacturing a semiconductor device, the semiconductor device including a plurality of stacked semiconductor chips each having a plurality of electrodes including through-via electrodes and external connecting electrodes, the electrodes provided in the semiconductor chips being connected by solder to form connections, thereby providing electric conduction between the semiconductor chips, wherein a recess is formed in at least one surface of the through-via electrode in each of the connections of the interconnected semiconductor chips, and the solder is provided in the interior thereof with a core formed of a material higher in melting point than the solder, the core being adapted to engage in the recess upon melting of the solder to effect positioning between the semiconductor chips, the core being spherical in shape and including two types of cores, one of the cores being a large-diameter core and the other a small-diameter core, the method comprising the steps of:

disposing an adhesive applying mask onto one of the semiconductor chips and applying an adhesive to solder ball to-be-disposed positions on the electrodes;

disposing a mask on the semiconductor chip, the mask having holes in to-be-disposed positions of one of two types of solder balls including solder balls with the large-diameter core and solder balls with the small-diameter core, the mask being not in contact with the adhesive present at to-be-disposed positions of the other solder balls and having a thickness not smaller than, but smaller than twice, the diameter of each of the one solder balls; and disposing the other solder balls on the semiconductor chip with use of a mask, the mask having holes in all solder ball to-be-disposed positions and having a thickness not smaller than, but smaller than twice, the diameter of each of the other solder balls, allowing the solder balls having the large- and small-diameter cores to be disposed on the semiconductor chip, and melting the solder to connect the semiconductor chip and the semiconductor chip stacked thereon with each other. The adhesive is selected from flux or solder paste.

According to the present invention, there is further provided a method for manufacturing a semiconductor device, the semiconductor device including a plurality of stacked semiconductor chips each having a plurality of electrodes including through-via electrodes and external connecting electrodes, the electrodes provided in the semiconductor chips being connected by solder to form connections, there by providing electric conduction between the semiconductor chips, wherein a recess is formed in at least one surface of the through-via electrode in each of the connections of the interconnected semiconductor chips, and the solder is provided in the interior thereof with a core formed of a material higher in melting point than the solder, the core being spherical in shape and including two types of cores, one of the cores being a large-diameter core and the other a small-diameter core, the method comprising the steps of:

disposing one of two types of solder balls including solder balls with the large-diameter core and solder balls with the small-diameter core onto solder ball to-be-disposed positions on the electrodes of one of two semiconductor chips to be joined;

disposing the other solder balls on solder ball to-be-disposed positions of the other semiconductor chip; and heating under pressure the cored solder ball-disposed surfaces of the semiconductor chips to join the semiconductor chips by melting of the solder. The semiconductor chips may each be in the state of a wafer.

In the present invention, by using semiconductor chips having hollow through-via electrodes formed with a recess and solder balls each having a core formed of a material higher in melting point than solder, the position of each solder ball and the core thereof is determined by the recess, so that the control of the connection height between semiconductor chips and the alignment in the semiconductor surface direction become easier when connecting the semiconductor chips.

Moreover, with the core formed of a material higher in melting point than solder, the core shape is maintained even at a higher than the melting point of solder, thus making it possible to control the connection height of semiconductor chips and prevent tilting of the chips. Since an urging load is borne by a solid core, it becomes possible to join semiconductor chips of a large warpage by imparting a relatively high load to the chips.

DETAILED DESCRIPTION OF THE PREFERRED EMBODIMENTS

Embodiments of the present invention will be described below.

First Embodiment

Figure 1A:
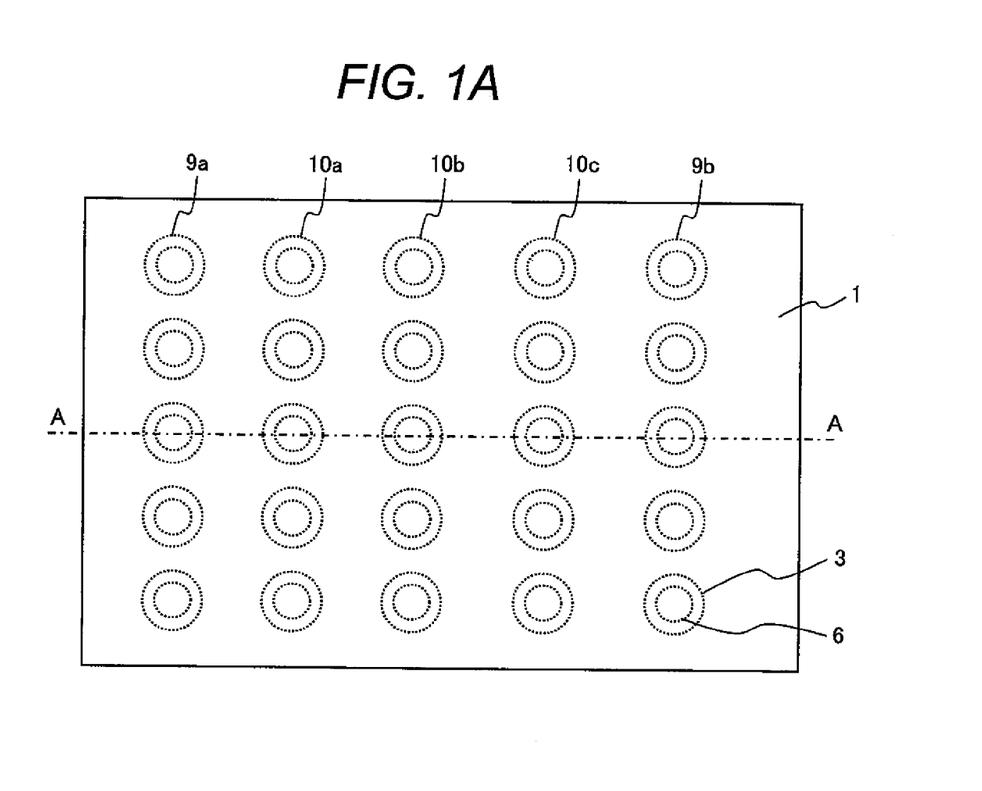
FIGS. 1A and 1B are schematic diagrams showing a semiconductor device according to a first embodiment of the present invention.
Figure 1B:
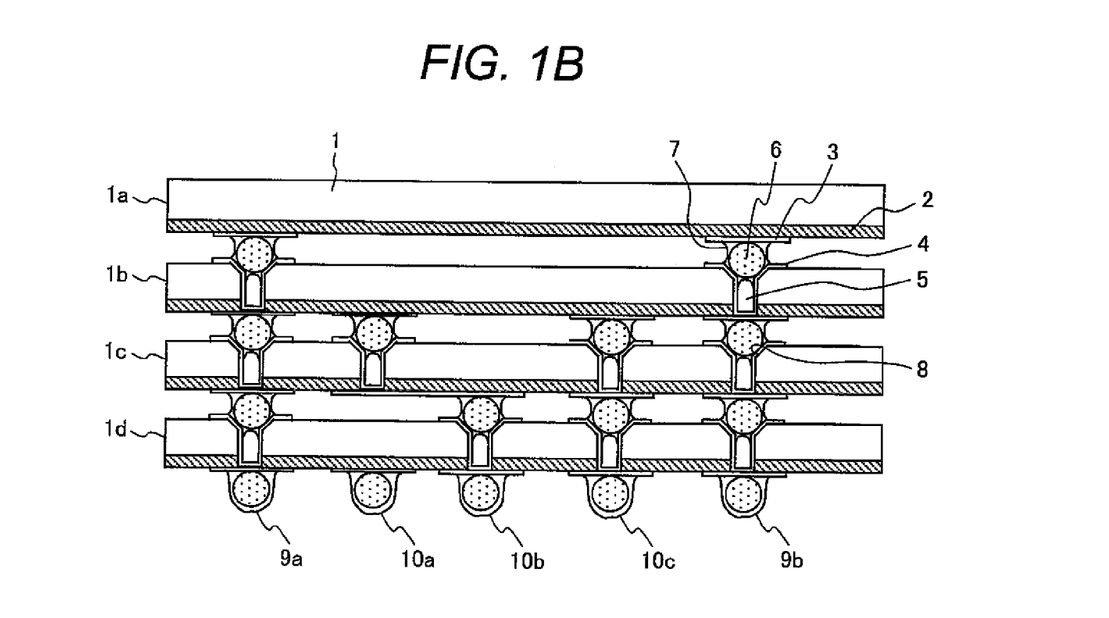

A first embodiment of the present invention will now be described with reference to FIGS. 1A and 1B. FIG. 1A is a schematic plan view of a semiconductor device according to the first embodiment. Connections 9a, 9b and 10a to 10c for connecting semiconductor chips are arranged in five rows in each of longitudinal and transverse directions of the semiconductor chips. FIG. 1B is a schematic sectional view along A-A of FIG. 1A.

(Construction of Semiconductor Device)

The semiconductor device is constructed by stacking four silicon semiconductor chips 1a to 1d. The semiconductor chips 1a to 1d are each provided with a device/wiring layer 2 formed on a lower surface of a silicon substrate 1, and external connecting electrodes 3 conducting with the exterior and formed of Al are provided on the surface of the layer 2. Through-silicon via electrodes 4 are provided in the other semiconductor chips 1b to 1d than the top semiconductor chip 1a. The through-silicon via electrodes 4 are each formed by plating the surface of a through hole 5 with Au through an insulating layer which through hole extends through the silicon substrate 1. The through-silicon via electrodes 4 are each in conduction with the associated external connecting electrode 3. The silicon substrate may be substituted by a substrate of, for example, germanium, gallium arsenide, or silicon carbide.

Near an upper portion of each through-silicon via electrode 4 is provided a conical tapered portion 8 coaxially with the through hole 5. A central portion of the through-Silicon via electrode 4 is hollow. A generally spherical core 6 is disposed between each external connecting electrode 3 of an overlying semiconductor chip and the tapered portion 8 of the associated through-silicon via electrode 4 of an underlying semiconductor chip. Further, with solder 7, the core 6 and the external connecting electrode 3 are joined together metallically and the core 6 and the through-silicon via electrode 4 are also joined together metallically, to form a connection, whereby both semiconductor chips are conducted with each other. The core 6 need not always be a perfect sphere. It may have concaves and convexes within an allowable range of the connection height between the semiconductor chips. For example, the core 6 may be in the form of a polyhedron or a spheroid.

In the first embodiment, as the material of the core 6 there is used copper Cu which is higher in melting point than the solder 7, and Sg—Ag—Cu alloy is used as the material of the solder 7, thus achieving the use of Pb-free materials.

In FIG. 1B, the connections 9a and 9b positioned at left and right ends respectively are conducting with all the semiconductor chips 1a to 1d, while the three connections 10a to 10c located centrally provide connections between only specific semiconductor chips. For connection of a power supply circuit there may be used the connections 9a and 9b conducting with all the semiconductor chips 1a to 1d. For connection of a circuit to transmit and receive signals between only specific semiconductor chips there may be used the connections 10a to 10c which provide conduction between only specific semiconductor chips.

In the first embodiment, when forming each through-silicon via electrode 4, a central portion of the associated through hole 5 extending through the silicon substrate 1 is not filled with Au but is made hollow. Consequently, not only the material cost of Au used can be saved, but also the time required for plating can be shortened, thus leading to the reduction of cost.

Moreover, by disposing the core 6 in the central tapered portion 8 in the through hole 5, not only the alignment becomes easier when stacking semiconductor chips by melting solder, but also the connection height can be controlled by changing the height of the core 6, thus making it possible to stack semiconductor chips with a high accuracy while ensuring an appropriate space between the chips. Consequently, it becomes easier to fill underfill resin or the like between the semiconductor chips. Further, since each external connecting electrode 3, as well as the associated core 6 and through-silicon via electrode 4, are strongly joined metallically with the solder 7, there is a feature that long-term reliability can be ensured.

In the first embodiment, both thermal resistance and electrical resistance of each connection can be diminished by using, as the material of core, Cu which is higher in both thermal conductivity and electrical conductivity than solder. When the difference in thermal expansion from silicon is to be diminished, such metal as W or Mo may be used instead of Cu. The core material may be an insulator or a material having a certain degree of elasticity. Thus, for example a plastic material is employable.

(Semiconductor Device Manufacturing Method)

Figure 2A:
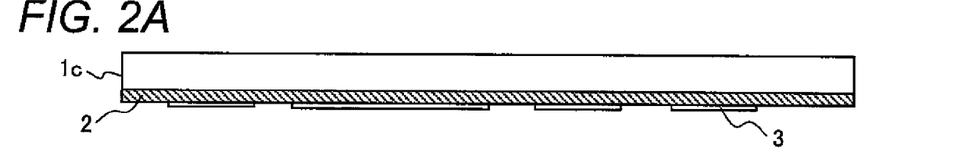
FIG. 2A to 2E are schematic diagrams showing a method for manufacturing the semiconductor device according to the first embodiment.

Next, with reference to FIG. 2A to 2E, a description will be given about a method for manufacturing the semiconductor device according to the first embodiment. First, as shown in FIG. 2A, there is provided a semiconductor chip 1c, the chip 1c having a device/wiring layer 2 on a lower surface of a silicon substrate 1 and external connecting electrodes 3 on part of a surface of the device/wiring layer 2.

Figure 2B:
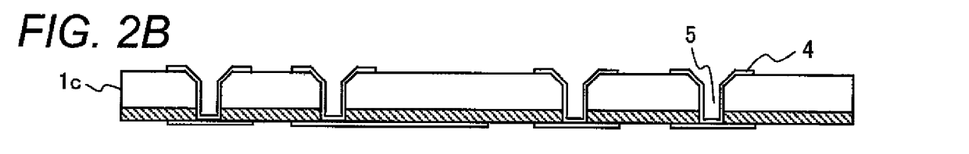

Then, as shown in FIG. 2B, through holes 5 are formed in the silicon substrate 1 and their surfaces are plated to form through-silicon via electrodes 4 for conduction between upper and lower surfaces of the semiconductor chip 1. As a method for fabricating the through-silicon via electrodes 4, there may be adopted, for example, the technique disclosed in Japanese Patent Laid-Open No. 2007-305774.

Figure 2C:
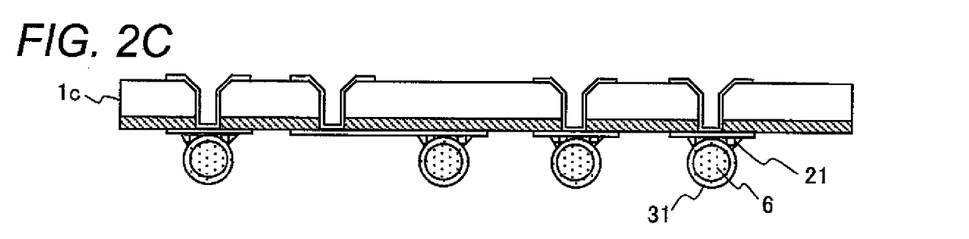

Next, as shown in FIG. 2C, flux 21 is applied to surfaces of the external connecting electrodes 3 and solder balls 31 each having a core 6 in the interior thereof are disposed on flux surfaces. At this time, the solder balls 31 are bonded to the external connecting terminals 3 respectively by virtue of viscosity of the flux 21. Although in this first embodiment the flux 21 is used for fixing the external connecting terminals and the solder balls 31, a pasty solder material or the like can also be used. In this case, however, it is to be noted that the amount of solder in each connection increases by the amount of solder contained in the paste.

Figure 2D:
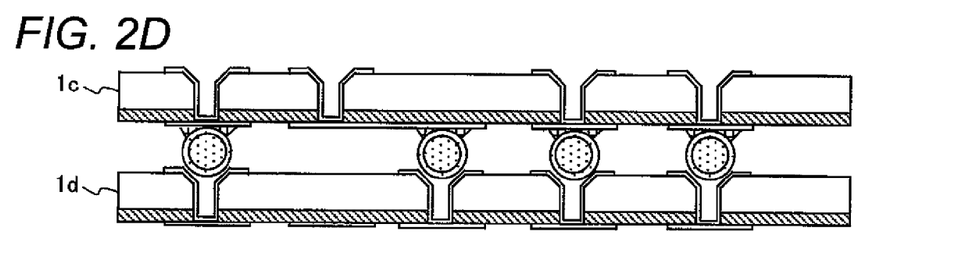

Then, as shown in FIG. 2D, two semiconductor chips 1c and 1d are put one on the other. At this time, the solder balls 31 on the overlying semiconductor chip 1c are disposed on tapered portions 8 of the through-silicon via electrodes 4 in the underlying semiconductor chip 1d. With the tapered portions 8, the solder balls 31 are automatically positioned centrally of the through-silicon via electrodes 4. The solder balls 31 on the semiconductor chip 1c are not completely fixed to the external connecting electrodes 3 but are fastened temporarily by virtue of viscosity of the flux 21, and therefore can move easily in the semiconductor chip surface direction for alignment.

Figure 2E:
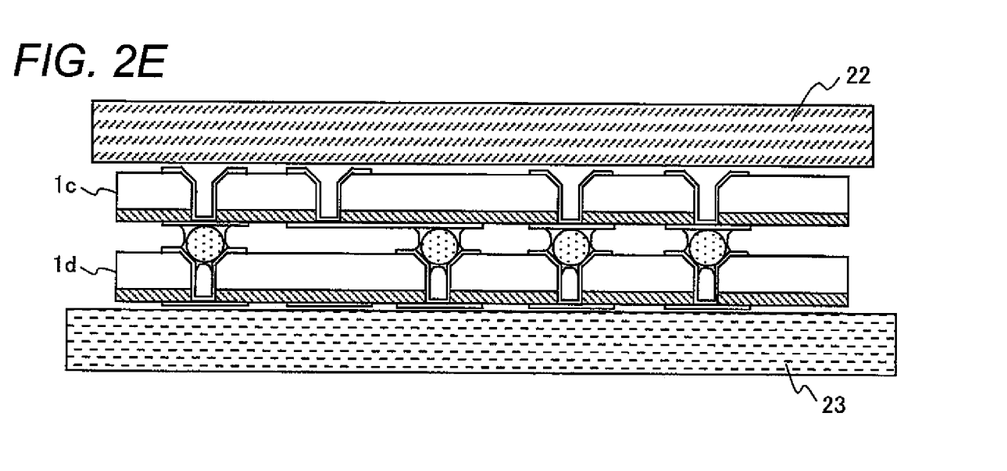

Next, as shown in FIG. 2E, the stacked semiconductor chips 1c and 1d are disposed on a base 23 and the temperature is raised up to the melting point or higher of the solder 7 while imparting an urging load to the chips from above with use of an urging/heating jig 22. In the case of the semiconductor chips 1c and 1d being thin, their warpages become more conspicuous, but when joining the two chips, the warpages are corrected by pushing the urging/heating jig 2 against the chips, so that it is possible to prevent a defective connection caused by warpage. Besides, even if the temperature is raised to the melting temperature of the solder 7 or higher, the core 6 does not melt but bears the urging load, whereby it is possible to prevent the connection from being crushed with the urging load and hence possible to control the connection height between the semiconductor chips. Further, even when there occurs a temperature distribution in the interior of each of the semiconductor chips 1c and 1d at the time of raising the temperature and there occurs a difference in the melting time of the solder among the connections, tilting of the semiconductor chips is prevented by the cores 6 and it is possible to ensure certain spacing between the semiconductor chips.

Thus, semiconductor chips can be stacked in two stages by the above method. A three- or more-stage multilayer stacking can also be done by carrying out the above method repeatedly. Although in this first embodiment the stacking is performed stage by stage, it is also possible to stack all stages of semiconductor chips 1a to 1d at a time. Further, although semiconductor chips are stacked in this first embodiment, the stacking may be done using wafers before cutting out a semiconductor into a chip shape. In these cases, however, it is necessary to conduct for example a temperature control so that soldering can be done appropriately in all of connections for stacking.

Second Embodiment

Construction of Semiconductor Device

Figure 3:
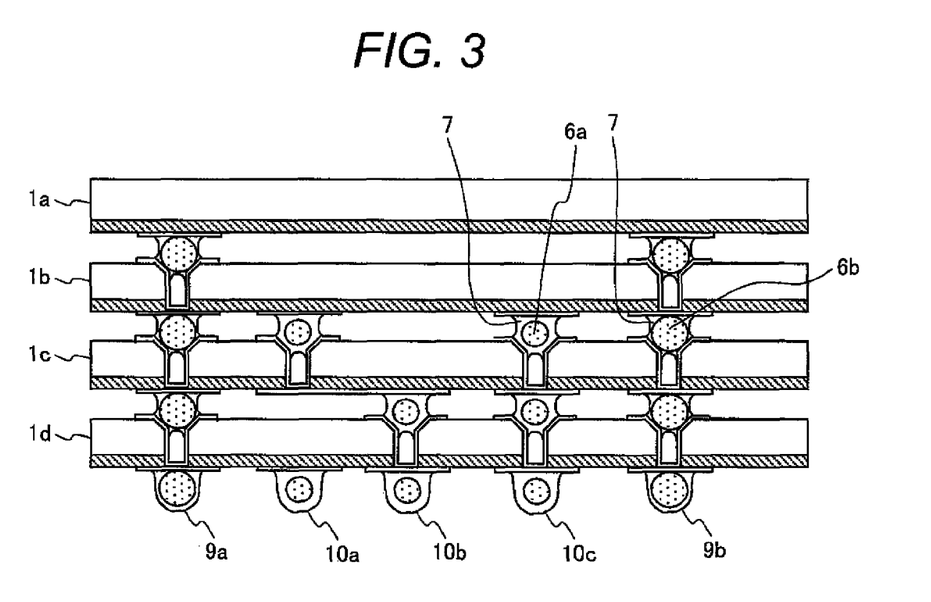
FIG. 3 is a schematic diagram showing a semiconductor device according to a second embodiment of the present invention.

FIG. 3 is a schematic diagram of a semiconductor device according to a second embodiment of the present invention. A difference from the first embodiment resides in that the diameter of a core 6a used in connections 10a, 10b and 10c is smaller than that of a core 6b used in connections 9a and 9b. In the case where the diameter of the core 6a used in the connections 10*a*, 10*b* and 10*c* is small, the solder 7 present between the core 6*a* and an external connecting electrode 3 and the solder 7 present between the core 6*a* and a through-silicon via electrode 4 become thicker. The solder is softer than Cu which is the material of the core 6*a*; besides, it becomes liquid when joining semiconductor chips. Therefore, an urging load applied to semiconductor chips when joining is borne mainly by the connections 9*a* and 9*b* using the larger core 6*b*. At least two core diameters are needed, and three or more core diameters may be used, depending on the shape of electrode for example.

As a result, in each of the connections 9*a* and 9*b*, a relatively large stress is induced around the external connecting electrode 3 and the through-silicon via electrode 4, while the stress induced around each of the connections 10*a*, 10*b* and 10*c* is small. Accordingly, if a thick supply line to cope with a large current is disposed in each of the connections 9*a* and 9*b* and a signal line using a fine line is disposed in each of the connections 10*a*, 10*b* and 10*c*, it is possible to prevent breaking of the fine signal line.

Figure 4A:
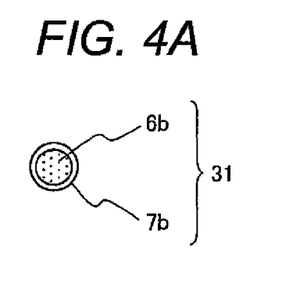
FIGS. 4A to 4C are schematic diagrams showing solder balls used in the second embodiment.
Figure 4B:
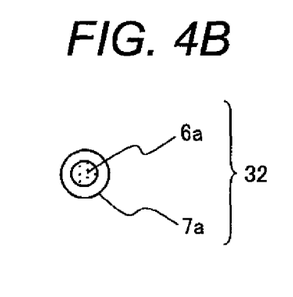
Figure 4C:
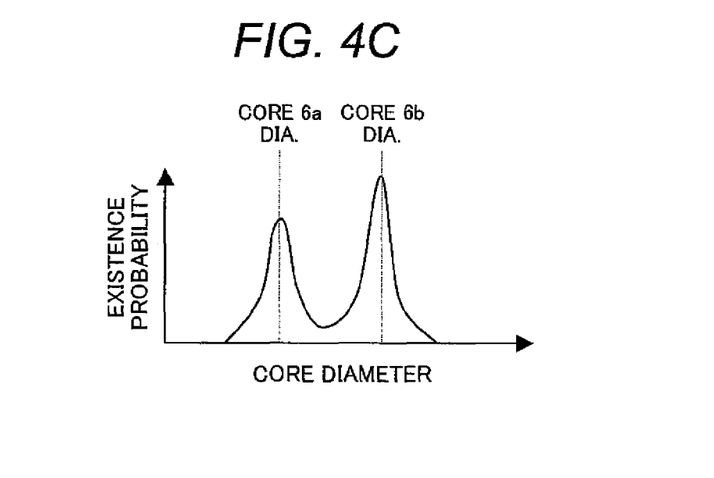

FIGS. 4A to 4C are schematic diagrams showing a solder ball 31 composed of a core 6*b* and solder 7*b* before assembly and a ball 32 composed of a core 6*a* and solder 7*a* before assembly. Although the cores disposed inside are different in size, an external shape of the solder ball 31 and that of the solder ball 32 are made almost equal to each other by changing the thickness of solder forming connections. Many connections are present in a single semiconductor device and the size of cores used therein vary depending on manufacturing errors. Therefore, the diameters of cores used in one semiconductor device are distributed in a state of having two peaks as shown in FIG. 4C.

Figure 5A:
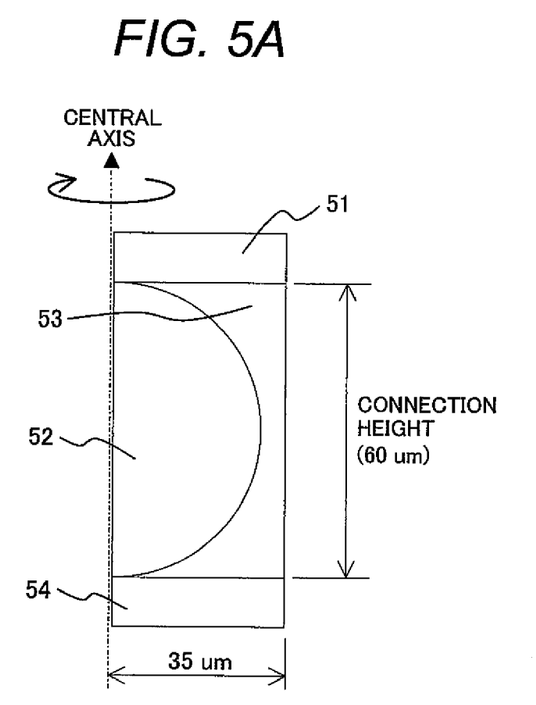
FIGS. 5A to 5C are schematic diagrams showing a thermal resistance of a solder in the present invention.
Figure 5B:
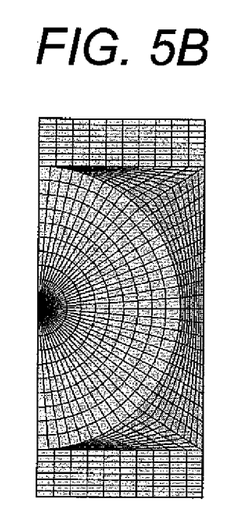
Figure 5C:
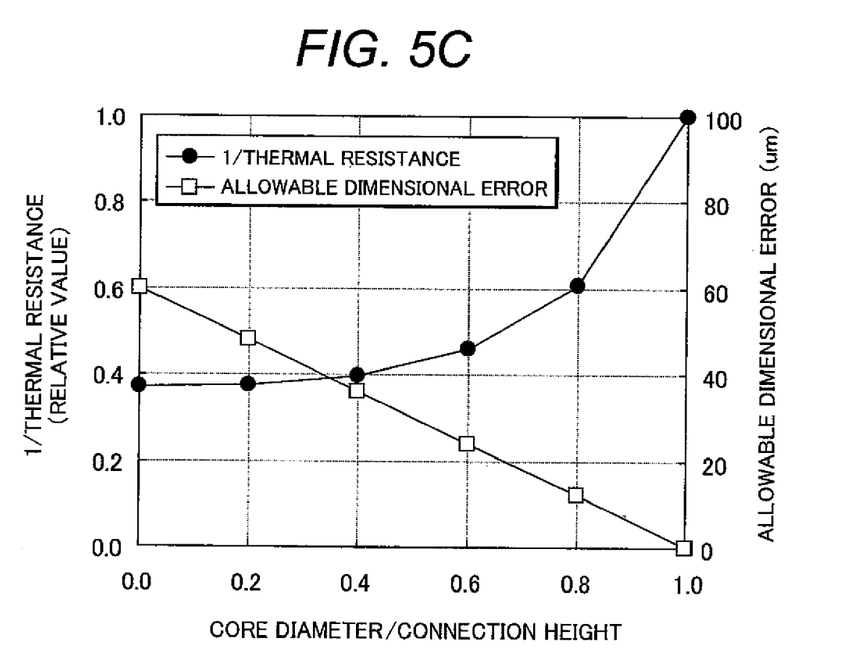

FIGS. 5A to 5C are schematic diagrams showing a thermal resistance of cored solder balls. For examining the effect resulting from changing the size of an internal core of solder, a relation between core size and a thermal resistance of a connection was evaluated by a finite element method. This analysis was carried out using a two-dimensional axisymmetric model for a shape in which 10-μm thick Cu electrodes were provided above and below a Cu core 52 shown in FIG. 5A and were connected with each other using solder. The spacing (connection height) between the electrodes was set at 60 μm and the size of the core was changed in the range of between 0 to 60 μm. In this state a constant heat flux was applied to both upper and lower electrodes and a thermal resistance was determined on the basis of the resulting difference in temperature between both electrodes. FIG. 5B shows a finite element model used in the analysis and FIG. 5C shows the results of the analysis. In FIG. 5C, the axis of abscissa represents a core diameter to connection height ratio, an axis of ordinate located on the left side represents a reciprocal of thermal resistance made dimensionless on the basis of the thermal resistance at a maximum core, and an axis of ordinate located on the right side represents an allowable dimensional error in a state of the core 6*a* being smaller than the core 6*b*.

The higher becomes the position on the left-hand axis of ordinate, the smaller the thermal resistance and the more advantageous to heat dissipation. Likewise, the higher becomes the position on the right-hand axis of ordinate, the larger the allowable dimensional error and the more advantageous to manufacture. In this graph, the larger becomes the core diameter, the larger the reciprocal (thermal conductivity) of heat resistance and the smaller the allowable dimensional error. Thus, both are in trade-off relation.

Therefore, the core size is preferably determined in a range in which the rise of thermal resistance and a dimensional error permitting manufacture can be compatible with each other on the basis of the graph in question. On the other hand, in the case of a resin core, the larger becomes the core diameter, the higher the thermal resistance, contrary to a metal core.

Next, a description will be given about a method for manufacturing the semiconductor device according to the second embodiment. According to this method, unlike the method described in the first method, there are used solder balls having cores of two diameters. Two manufacturing methods will be described below in connection with this second embodiment.

(First Semiconductor Device Manufacturing Method)

Figure 6A:
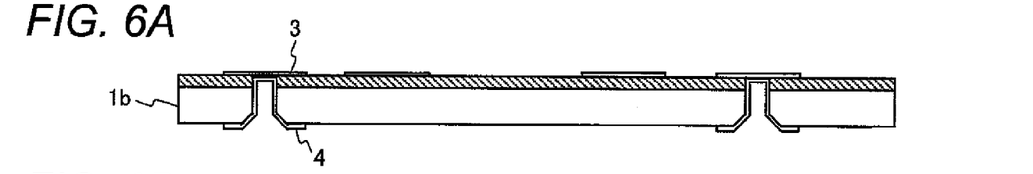
FIG. 6A to 6L are schematic diagrams showing steps (a) to (l) in a first method for manufacturing the semiconductor device according to the second embodiment.
Figure 6B:
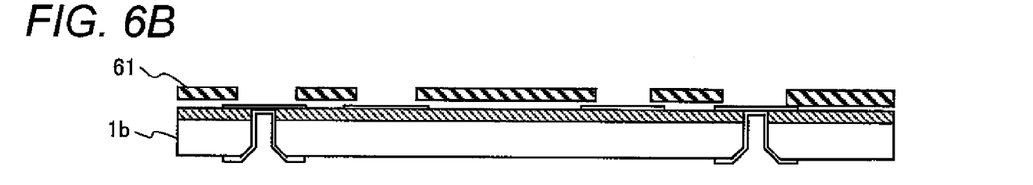
Figure 6C:
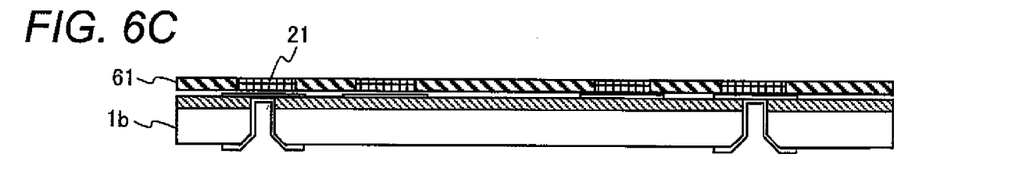
Figure 6D:
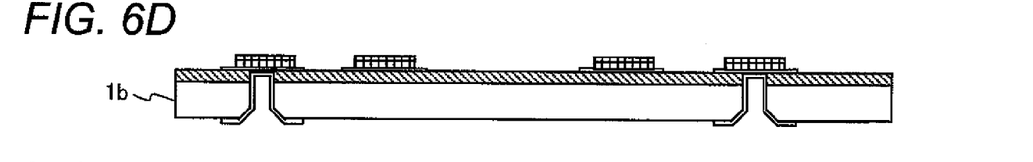

A first manufacturing method will now be described with reference to FIGS. 6A and 6B. First, as shown in FIG. 6A, a semiconductor chip 1*b* having through-silicon via electrodes 4 is provided. Next, as shown in FIG. 6B, a mask for flux having holes in solder ball to-be-disposed positions is put on the semiconductor chip 1*b* and, as shown in FIG. 6C, flux 21 is applied onto the semiconductor chip 1*b* through the mask 61 for flux, then the mask 61 is removed as shown in FIG. 6D.

Figure 6E:
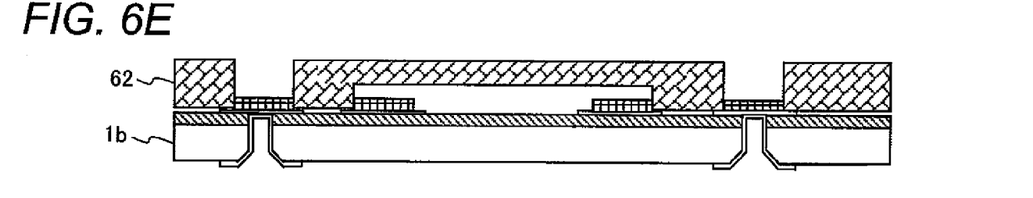
Figure 6F:
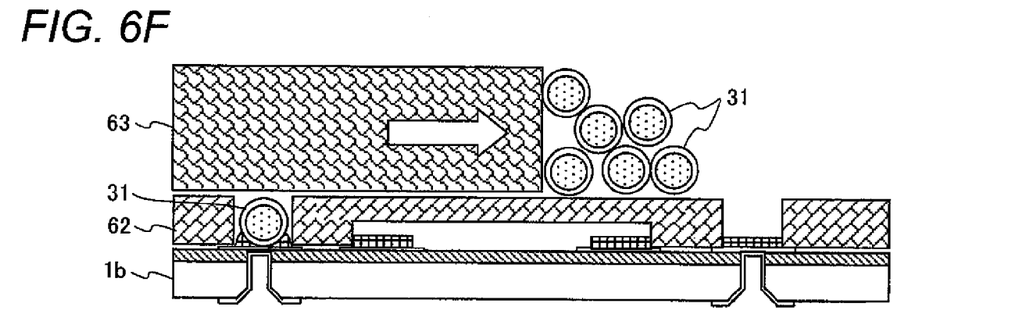
Figure 6G:
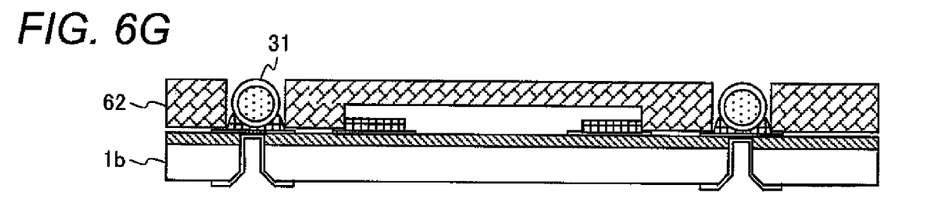

Next, as shown in FIG. 6E, a mask 62 for solder balls is put on the semiconductor chip 1*b*, the mask 62 having holes in to-be-disposed positions of solder balls 31 with large-diameter cores and being not in contact with the surface of the flux 21 applied to each of the to-be-disposed positions of solder balls 32. Then, as shown in FIG. 6F, the solder balls 31 disposed plurally on the mask 62 for solder balls are moved on the mask 62 with a jig 63, whereby the solder balls 31 are disposed in the holes respectively of the mask 62. In this case, by setting the thickness of the mask 62 at a value larger than the diameter of each solder ball 31 and smaller than twice the diameter, it is possible to prevent plural solder balls 31 from getting into one hole. Then, the remaining solder balls 31 and the jig 63 are removed from the upper surface of the semiconductor chip 1*b*, whereby the solder balls 31 can be disposed one by one in the holes, as shown in FIG. 6G.

Figure 6H:
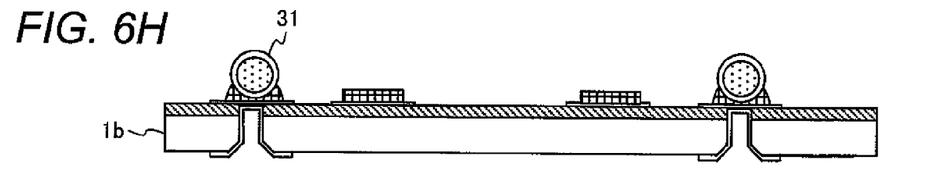

Thereafter, the mask 62 for solder balls is removed as in FIG. 6H. At this time, the solder balls 31 remain bonded onto the external electrodes respectively by virtue of the viscosity of the flux 21, so that the positions of the solder balls 31 do not shift largely even upon removal of the mask 62 for solder balls.

Figure 6I:
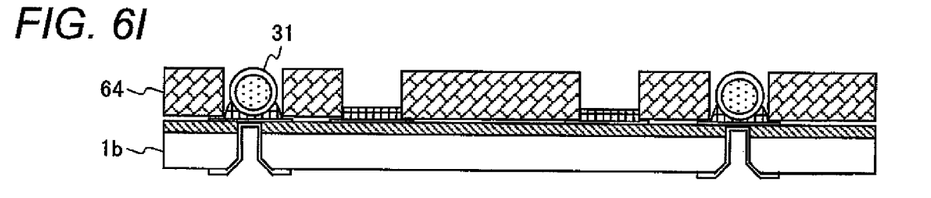
Figure 6J:
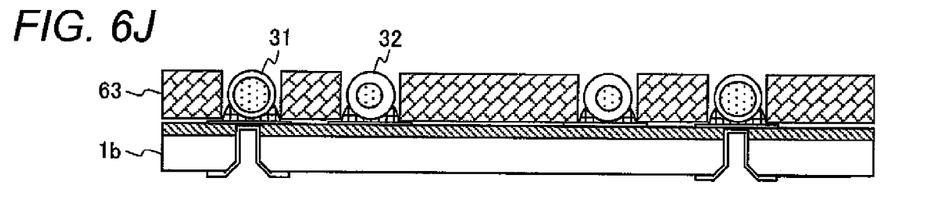
Figure 6K:
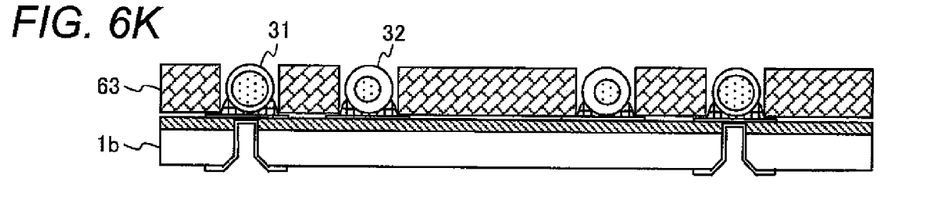

Next, as shown in FIG. 6I, a mask 63 for solder balls is put on the semiconductor chip 1*b*, the mask 63 having holes in to-be-disposed positions of both solder balls 31 and solder balls 32 with small-diameter cores. Then, in the same way as in FIG. 6F the solder balls 32 are disposed in vacant holes as in FIG. 6J. At this time, in the to-be-disposed positions of the solder balls 31, there already have been disposed solder balls 31 and thus there is no fear of replacement of the solder balls 31 present in the holes by the solder balls 32.

Figure 6L:
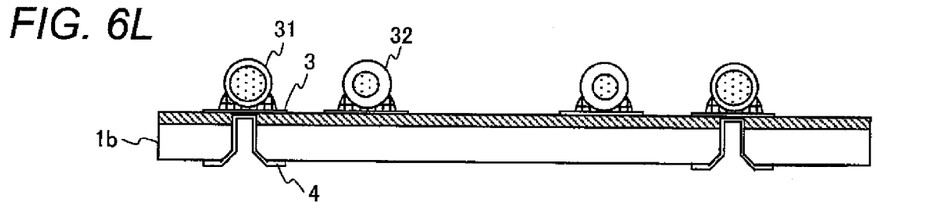

Lastly, the mask 62 for solder balls is removed, whereby the solder balls 31 and 32 having different core diameters can be disposed on a single semiconductor chip, as shown in FIG. 6L. The manufacturing method which follows the above operations is the same as in the first embodiment.

(Second Semiconductor Manufacturing Method)

Figure 7A:
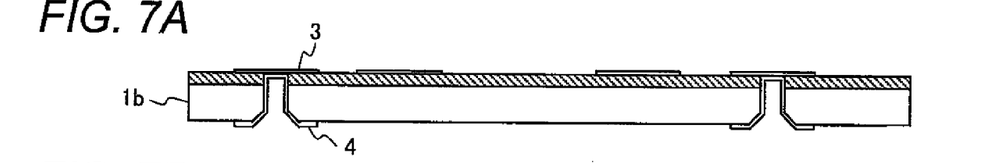
FIG. 7A to 7G are first schematic diagrams showing a second method for manufacturing the semiconductor device according to the second embodiment.
Figure 7B:
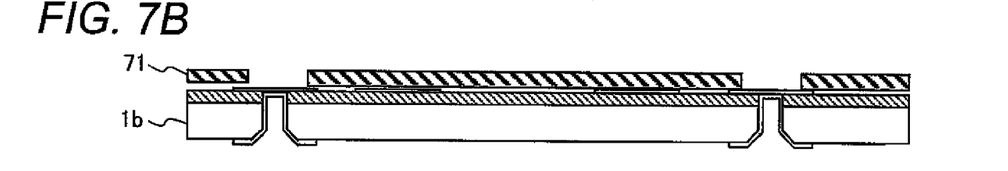
Figure 7C:
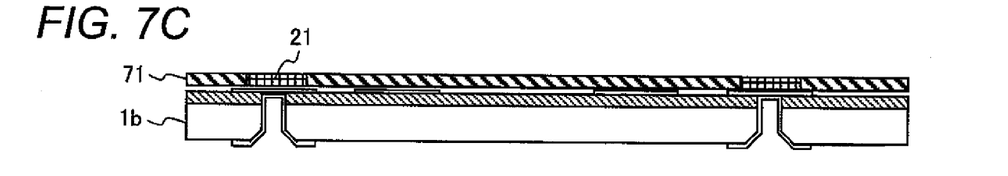
Figure 7D:
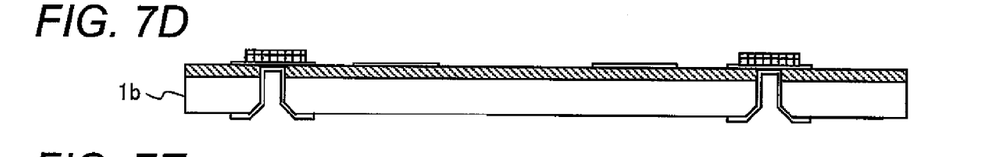

A second manufacturing method will now be described with reference to FIGS. 7A to 7G, 8A to 8G, and 9A to 9B. First, as shown in FIG. 7A, there is provided a semiconductor chip 1*b* which serves as an upper stage when stacking, as shown in FIG. 7A. Then, as shown in FIG. 7B, a mask 71 for flux having holes in to-be-disposed positions of solder balls 31 is put on the semiconductor chip 1*b* and flux 21 is applied onto the chip through the mask 71 as in FIG. 7C, then the mask 71 is removed as in FIG. 7D.

Figure 7E:
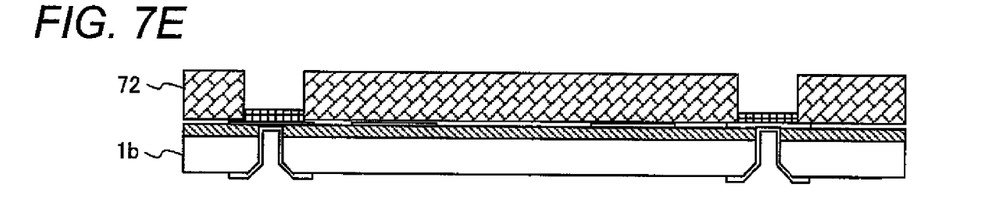
Figure 7F:
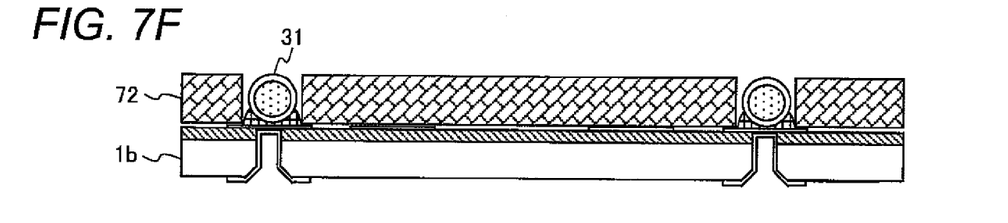
Figure 7G:
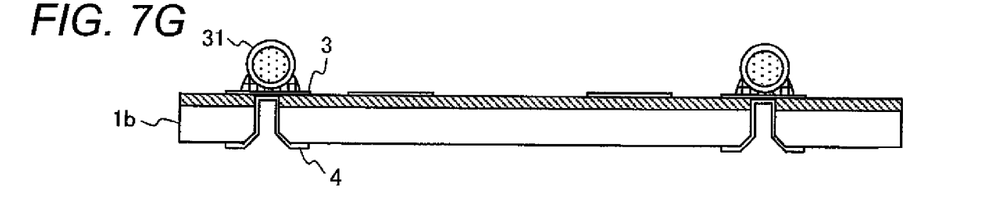
Figure 8A:
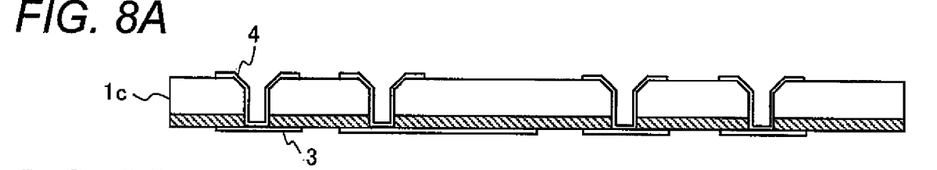
FIG. 8A to 8G are second schematic diagrams showing the second method for manufacturing the semiconductor device according to the second embodiment.
Figure 8B:
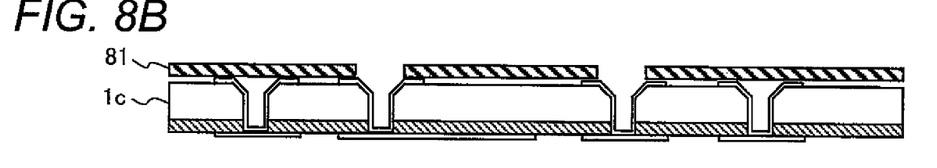
Figure 8C:
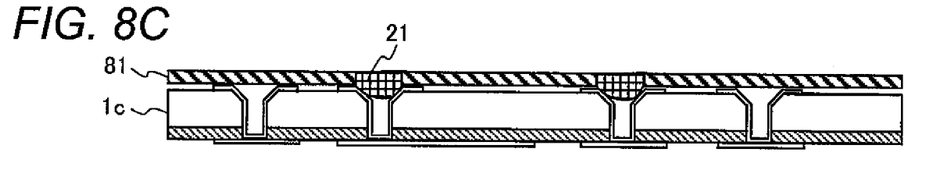
Figure 8D:
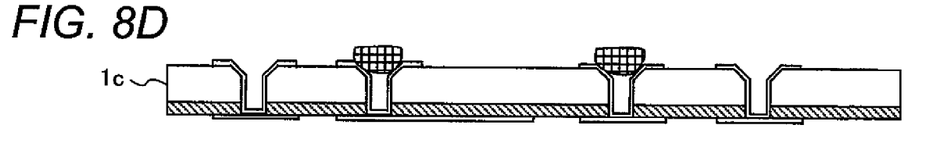
Figure 8E:
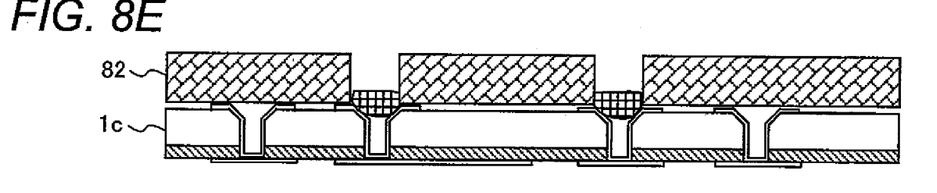
Figure 8F:
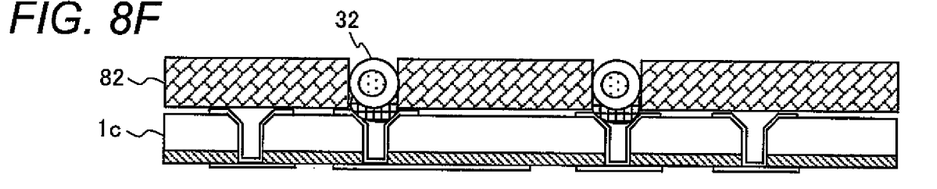
Figure 8G:
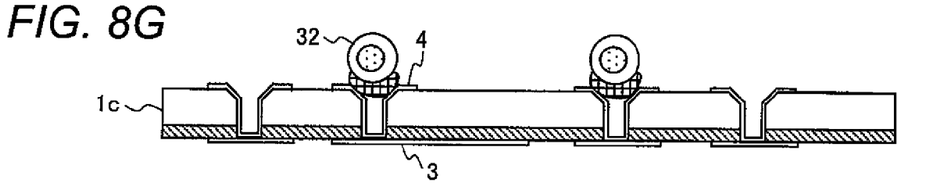

Next, as shown in FIG. 7E, a mask 72 for solder balls is put on the semiconductor chip 1*b*, the mask 72 having holes in to-be-disposed positions of solder balls 31 with large-diameter cores, and the solder balls 31 are disposed in the holes as in FIG. 7F, then the mask 72 is removed as in FIG. 7G.

Next, as shown in FIG. 8A to 8G, a semiconductor chip 1c which serves as a lower stage when stacking is provided, then in the same way as in FIG. 7A to 7G, solder balls 32 each having a small-diameter core are disposed on the semiconductor chip 1c using a mask 81 for flux and a mask 82 for solder balls, both masks being different in only hole positions from the masks used previously.

However, since the flux 21 and the solder balls 32 are disposed at tapered portions of through-silicon via electrodes 4, it is necessary that the thickness of the mask 81 for flux and that of the mask 82 for solder balls be made different from those of the mask 71 for flux and the mask 72 for solder balls, taking sinking into account.

Figure 9A:
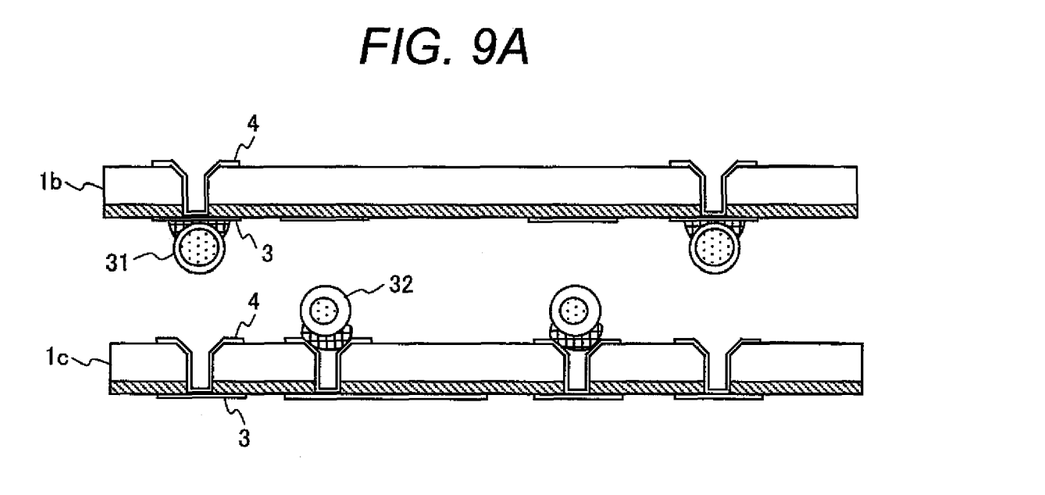
FIGS. 9A and 9B are third schematic diagrams showing the second method for manufacturing the semiconductor device according to the second embodiment.
Figure 9B:
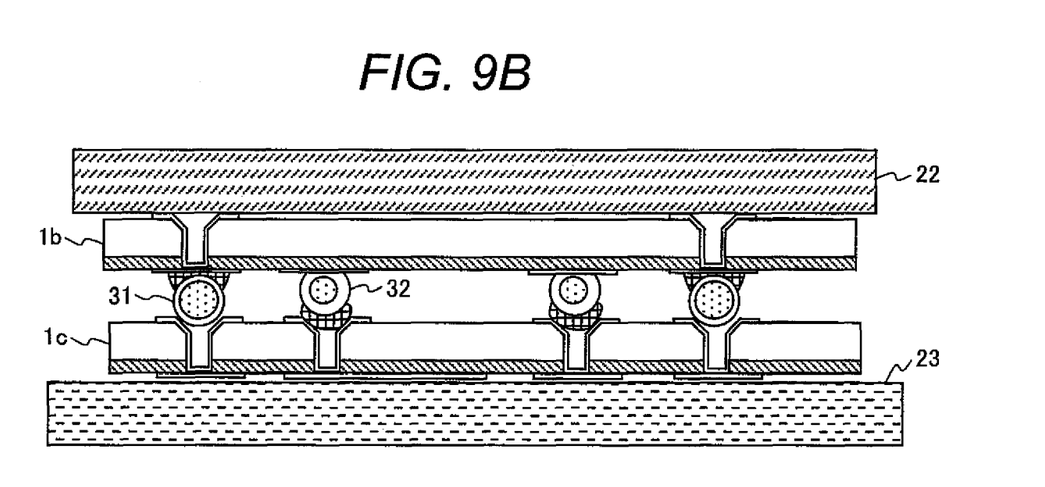

Lastly, as shown in FIGS. 9A and 9B, the semiconductor chip 1b with the solder balls 31 disposed on the device surface side and the semiconductor chip 1c with the solder balls 32 disposed on the through electrode side are stacked one on the other, whereby it becomes possible to effect stacking which uses two types of solder balls.

The following description is now provided about the difference between the first manufacturing method shown in FIG. 6 and the second manufacturing method shown in FIGS. 7A to 7G, 8A to 8G, and 9A and 9B. In the first manufacturing method, two or more types of solder balls can be disposed on one semiconductor chip and it is not necessary to provide a step of inverting one of upper and lower semiconductor chips when stacking. On the other hand, since the masks used are complicated in shape, there is the problem that the mask fabricating cost becomes higher than in the second manufacturing method. On the basis of these differences, the manufacturing methods can be adopted selectively in accordance with the product to be manufactured.

Third Embodiment

Figure 10:
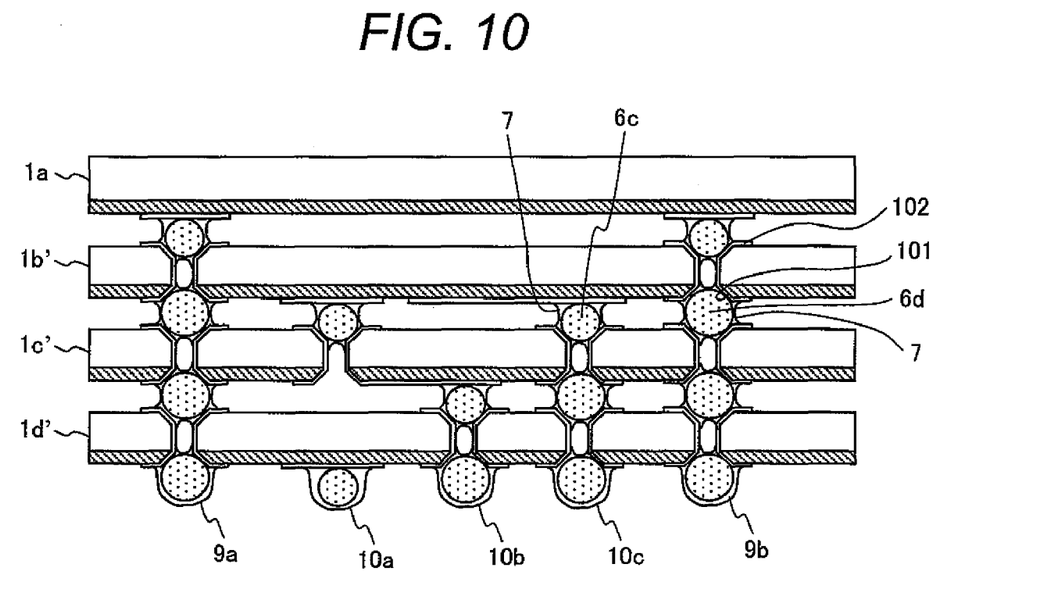
FIG. 10 is a schematic diagram showing a semiconductor device according to a third embodiment of the present invention.

FIG. 10 is a schematic diagram of a semiconductor device according to a third embodiment of the present invention. A difference from the previous first and second embodiments resides in that through-via electrodes 102 present in semiconductor chips 1b', 1c' and 1d' extend not only through silicon substrates but also through the whole of the semiconductor chips, with a tapered portion 101 being provided also on the device/wiring layer side of each through-via electrode 102. Since such tapered portions are present both above and below each core 6d, the diameter of the core 6d is set larger than that of a core 6c in order to obtain the same connection height.

By providing tapered portions at both upper and lower electrodes of each core as in this third embodiment, not only the alignment in assembly becomes easier and more positive, but also a withstand load becomes larger in the event of occurrence of a shear load in a connection, with consequent improvement of reliability. That is, in the first and second embodiments, highly rigid cores are disposed on the external connecting electrodes 3 respectively through a thin solder layer in each semiconductor chip and a shear load is borne by the thin solder layer, so that breakage of the thin layer is apt to occur. On the other hand, if tapered portions are provided at both electrodes above and below each core as in the third embodiment, a shear load is borne by both core and through electrode, and there no longer is any portion where the shear load is borne by only the solder layer, thus resulting in improvement of the shear strength.

Figure 11A:
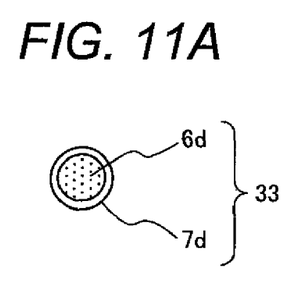
FIGS. 11A and 11B are schematic diagrams showing solder balls used in the third embodiment.
Figure 11B:
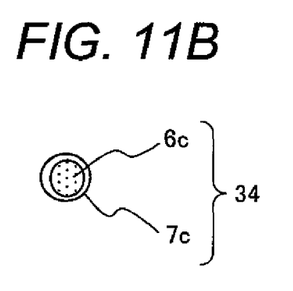

In the third embodiment, as shown in FIGS. 11A and 11B, not only the diameter of a core 6d of a solder ball 33 used in a connection having both upper and lower tapered portions is larger than that of a core 6c of a solder ball 34 used in a connection having a tapered portion on only one side, but also the solder balls 33 and 34 are different in outside diameter. However, the semiconductor device of this third embodiment can also be manufactured by the same method as the manufacturing method described above in the second embodiment.

Although the present invention has been described above concretely by way of embodiments thereof, it goes without saying that the present invention is not limited to the above embodiments and that various changes may be made within the scope not departing from the gist of the invention.

What is claimed is:

1. A semiconductor device comprising a plurality of stacked semiconductor chips each having a major surface and a plurality of electrodes including through-via electrodes and external connecting electrodes, the electrodes provided in the semiconductor chips being connected by solder to form connections, thereby providing electric conduction between the semiconductor chips, wherein said semiconductor device is configured so that said major surfaces of said semiconductor chips are substantially parallel to one another, wherein a recess is formed in at least one surface of the through-via electrode in each of the connections of the interconnected semiconductor chips, wherein the through-via electrodes are each a hollow through-via electrode having a hollow portion, and wherein the recess comprises a tapered portion formed co-axially with the through-via electrode, and wherein the solder is provided in the interior thereof with a core formed of a material higher in melting point than the solder, the core being adapted to engage in the tapered portion to permit, during melting of the solder between the semiconductor chips, control of the connection height between said semiconductor chips and alignment of said semiconductor chips while said solder is in a melted state to prevent tilting of the major surfaces of the semiconductor chips relative to one another.

2. The semiconductor device according to claim 1, wherein the core is formed by a spherical conductor.

3. The semiconductor device according to claim 1, wherein the core is formed by a spherical insulator.

4. The semiconductor device according to claim 1, wherein the core includes two types of cores, one of the cores being a large-diameter core and the other a small-diameter core.

5. The semiconductor device according to claim 4, wherein the large-diameter core is disposed in each of the connections used for the supply of electric power.

6. The semiconductor device according to claim 4, wherein the small-diameter core is disposed in each of wiring portions used for transmission and reception of signals.

* * * * *